(12) United States Patent
Lee et al.

(10) Patent No.: US 8,137,740 B2
(45) Date of Patent: Mar. 20, 2012

(54) METHOD OF FORMING ELECTRONIC MATERIAL LAYER AND METHOD OF MANUFACTURING ELECTRONIC DEVICE USING THE METHOD OF FORMING ELECTRONIC MATERIAL LAYER

(75) Inventors: Cheol Jin Lee, Seoul (KR); Sun Kug Kim, Seoul (KR)

(73) Assignee: Korean University Research and Business Foundation, Seongbuk-Gu, Seoul (KR)

( * ) Notice: Subject to any disclaimer, the term of this patent is extended or adjusted under 35 U.S.C. 154(b) by 0 days.

(21) Appl. No.: 12/700,488

(22) Filed: Feb. 4, 2010

(65) Prior Publication Data
US 2010/0233360 A1  Sep. 16, 2010

(30) Foreign Application Priority Data
Mar. 11, 2009  (KR) .................. 10-2009-0020728

(51) Int. Cl.
*B05D 5/12* (2006.01)
(52) U.S. Cl. .......................... 427/58; 977/932
(58) Field of Classification Search ...... 427/58
See application file for complete search history.

(56) References Cited

U.S. PATENT DOCUMENTS

| | | | |
|---|---|---|---|
| 2005/0184641 A1* | 8/2005 | Armitage et al. | 313/495 |
| 2006/0134236 A1* | 6/2006 | Menon et al. | 424/739 |
| 2007/0141345 A1* | 6/2007 | Rinzler et al. | 428/408 |
| 2009/0061194 A1* | 3/2009 | Green et al. | 428/220 |
| 2009/0142581 A1* | 6/2009 | Heintz et al. | 428/323 |
| 2010/0272981 A1* | 10/2010 | Rinzler et al. | 428/220 |

FOREIGN PATENT DOCUMENTS

| | | |
|---|---|---|
| KR | 1020020024580 A | 3/2002 |
| KR | 1020080065270 A | 7/2008 |

OTHER PUBLICATIONS

N.P. Armitage, J.-C.P. Gabriel, G. Gruner, Quasi-Langmuir-Blodgett thin film deposition of carbon nanotubes. J App Phys, 95, 3228-3230, 2004.*
T. T Maiyalagan & B. Viswanathan, Catalytic activity of platinum/tungsten oxide nanorod electrodes towards electro-oxidation of methanol, J. Power Sources, vol. 175, Issue 2, p. 789-793, 2008.*
D.K. Schwartz, J. Garnaes, R. Viswanathan, J.A.N. Zasadziniski, Surface Order and Stability of Langmuir-Blodgett Films, Science, 257, 508-511, 1992.*

(Continued)

*Primary Examiner* — Michael Cleveland
*Assistant Examiner* — James M Mellott
(74) *Attorney, Agent, or Firm* — Buchanan Ingersoll & Rooney PC

(57) ABSTRACT

A method of transferring an electronic material and a method of manufacturing an electronic device using the method of transferring the electronic material. The method of transferring the electronic material includes dipping a template, on which an electronic material layer is formed, into a liquid medium, separating the electronic material layer from the template, and floating the electronic material layer on a surface of the liquid medium; raising up the electronic material layer floated on the surface of the liquid medium by using a target substrate and transferring the electronic material layer on the target substrate; and fixing the electronic material layer to the target substrate.

13 Claims, 15 Drawing Sheets

OTHER PUBLICATIONS

N.P. Armitage, J.-C.P. Gabriel, G. Gruner, Quasi-Langmuir-Blodgett thin film deposition of carbon nanotubes. J App Phys, 95, 3228-3230, 2004.*

T. Maiyalagan & B. Viswanathan, Catalytic activity of platinum/tungsten oxide nanorod electrodes towards electro-oxidation of methanol, J. Power Sources, vol. 175, Issue 2, p. 789-793, 2008.*

D.K. Schwartz, J. Garnaes, R. Viswanathan, J.A.N. Zasadziniski, Surface Order and Stability of Langmuir-Blodgett Films, Science, 257, 508-511, 1992.*

Armitage et al., "Quasi-Langmuir—Blodgett thin film deposition of carbon nanotubes", Journal of Applied Physics, vol. 95, No. 6, Mar. 15, 2004, pp. 3228-3330.

Office Action dated Jun. 24, 2011 in corresponding Korean Patent Application No. 10-2009-0020728, with translation.

* cited by examiner

METHOD OF FORMING ELECTRONIC MATERIAL LAYER AND METHOD OF MANUFACTURING ELECTRONIC DEVICE USING THE METHOD OF FORMING ELECTRONIC MATERIAL LAYER

CROSS-REFERENCE TO RELATED PATENT APPLICATION

This application claims the benefit of Korean Patent Application No. 10-2009-0020728, filed on Mar. 11, 2009, in the Korean Intellectual Property Office, the disclosure of which is incorporated herein in its entirety by reference.

BACKGROUND OF THE INVENTION

1. Field of the Invention

The present invention relates to a method of forming a material layer applicable to the field of electronics and a method of manufacturing an electronic device using the method of forming the material layer.

2. Description of the Related Art

Various types of electronic material layers are used in the field of electronics. Electronic material layers are formed of a material such as a conductive material or a semiconductor material, and are designed and manufactured in various patterns according to devices to which the electronic material layers are applied.

Electronic material layers are generally subjected to a film forming process, and some of the electronic material layers are subjected to a subsequent patterning process to have a desired shape.

Methods of forming a film may include a method of directly forming an electronic material layer on a target object and a method of forming an electronic material layer on an intermediate object and then transferring the electronic material layer to a target object.

A conductive thin film, which is an electronic material layer, is considered as an important element in display, antistatic, electrostatic dissipation, and so on. In particular, extensive research has been conducted on the use of a carbon nanotube (CNT) thin film in a heater and a thermal radiator because the CNT thin film has high electrical conductivity and high thermal conductivity.

Since CNTs have good charge transfer characteristics and a high aspect ratio, CNTs have high charge mobility and transparency, so as to obtain a plurality of charge transfer paths. Also, since CNTs have high elasticity, the CNTs are electrically and mechanically stable to bending. Accordingly, research on the use of CNTs as a material for a conductive thin film has been conducted.

Methods of manufacturing a CNT thin film may be roughly divided into a method of directly forming a thin film on a substrate by using a liquid medium in which CNTs are dispersed, and a method of growing CNTs and then transferring the CNTs to a substrate. Examples of the former method may include filtration, spraying, roll-to-roll processing, bar coating, dielectrophoresis, and inkjet printing. Since a thin film formed by the former method is affected by the state of a surface of a substrate or a material of the substrate, the quality of the thin film may vary according to the state of the substrate. Examples of the latter method mostly using a CNT thin film formed on a substrate made of silicon (Si) by chemical vapor deposition (CVD) may include transfer printing, such as stamping, and CNT separation using a sacrificial layer. Transfer printing has disadvantages in that undesired impurities may penetrate into a CNT thin film during a transfer process that uses a metal and a polymer, and a plurality of processes are required, thereby increasing manufacturing costs. CNT separation using a sacrificial layer involves forming a sacrificial layer made of $SiO_2$ or the like on a substrate made of Si during CNT synthesis, growing CNTs on the sacrificial layer, and removing the sacrificial layer to obtain a CNT thin film. The CNT separation using the sacrificial layer has a disadvantage in that since the yield of the CNT thin film formed by the CNT synthesis is low, there is a limitation in using the CNT separation and productivity is low.

Accordingly, it is preferable to directly form a CNT thin film on a substrate by using a CNT suspension in which synthesized CNTs are dispersed. However, since a conventional method of directly forming a CNT thin film on a substrate uses a liquid medium so that CNTs are attached to a substrate while a solvent is evaporated, the degree of dispersion of the CNTs in the liquid medium is reduced during the evaporation of the solvent, thereby degrading the quality of the CNT thin film. Accordingly, there is a demand for a method of manufacturing and transferring a CNT thin film which can rapidly remove a solvent.

SUMMARY OF THE INVENTION

The present invention provides a method of forming an electronic material layer on a target substrate and a method of manufacturing an electronic device using the method of forming the electronic material layer.

The present invention relates to a method of transferring an electronic material layer to a target substrate, a method of forming an electronic material layer irrespective of a material of a substrate or a state of a surface of the substrate, and a method of manufacturing an electronic device using the method of forming the electronic material layer.

According to an aspect of the present invention, there is provided a method of forming an electronic material layer, the method including: floating an electronic material layer on a surface of a liquid medium; and dipping a target substrate into the liquid medium, supporting the electronic material layer with the target substrate from below, and raising up the target substrate so that the electronic material layer is attached to the target substrate.

According to another aspect of the present invention, there is provided a method of forming an electronic material layer, the method including: forming an electronic material layer on a template by using a suspension containing an electronic material; separating the electronic material layer from the template in a liquid medium and floating the electronic material layer on a surface of the liquid medium; dipping a target substrate into the liquid medium, supporting the electronic material layer with the target substrate from below, and raising up the target substrate so that the electronic material layer is attached to the target substrate; and drying the electronic material layer and fixing the electronic material layer to the target substrate.

The electronic material may be divided into an acicular material, a granular material, and a 2-dimensional (2D) planar material. Examples of the acicular material may include a tubular, rod-shaped, or ribbon-shaped acicular electron emitting material having a constant length, and an acicular electron transporting material. Examples of the granular material may include a multi-dimensional granular electron emitting material and a granular electron transporting material. Examples of the 2D planar material may include a nano-sized 2D material such as graphene.

A method of forming an electronic material layer will now be explained in detail. CNT powder, which may be used as an acicular electron emitting material or an acicular electron transporting material, is uniformly dispersed in a suspension through suspension filtering to form a CNT colloid suspension, the CNT colloid suspension is supplied to a template having fine holes, and the CNT colloid suspension is filtered through the template and then dried to form a CNT layer having an optimal density for field electron emission or electron transport. Since CNTs of the CNT powder are very uniformly dispersed in the suspension, the CNT layer formed on the template have CNTs that are uniformly distributed.

The filter template on which the CNT layer is formed is dipped in a liquid medium, the CNT layer is separated from the template, and the CNT layer is floated on a surface of the liquid medium.

A target substrate is dipped into the liquid medium to support the CNT layer, floated on the surface of the liquid medium, from below so that the CNT layer is placed on a top surface of the target substrate. The CNT layer is dried by thermal treatment, and then the CNT layer is firmly fixed to the target substrate.

Since the electronic material layer, that is, the CNT layer, can be formed at low temperature or room temperature, not high temperature, problems, such as the difficulty of commercialization, a conventional method of forming an electronic material layer at high temperature encounters may not occur. Also, an electron emission source or an electron transport source including the CNT layer is structurally very stable and has strong electrical adhesion between the CNTs and the target substrate, an electronic device having good performance can be manufactured. Furthermore, since a conductive organic/inorganic material and a binder which may badly affect electron emission or electron transport characteristics are not used and the CNT layer can be simply manufactured at room temperature, it is easy to commercialize the CNT layer. Moreover, since the CNT layer is formed by using the suspension, the density of the CNT layer can be easily controlled by adjusting the concentration of the CNTs in the suspension, and thus a desired electron emission source or electron transport source can be realized. Here, an electron emission source refers to a device having an electron emission structure using an electric field, and an electron transport source refers to a device for controlling electron transport by using an electric field or other factors, such as a thin film transistor (TFT) or any of sensors.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

An electronic material layer is applied to various fields of electronics. For example, an electronic material layer may be used as an electron emission source in a field emission layer, as a channel layer in a thin film transistor (TFT), as a photosensitive layer for controlling the movement of charges due to photons in a photoelectric device, and a gas sensitive layer for controlling the movement of charges due to contact with gas in a gas sensor. Accordingly, the function of the electronic material layer may be determined according to a material used for the electronic material layer and a field to which the electronic material layer is applied. Accordingly, the technical scope of the present invention is not limited by the specific function of the electronic material layer described in embodiments herein below. A method of forming an electronic material layer that may have various functions and a method of manufacturing an electronic device using the method of forming the electronic material layer will now be explained.

FIGS. 1 through 4 are cross-sectional views illustrating a method of forming an electronic material layer.

Figure 1:
FIGS. 1 through 4 are cross-sectional views illustrating a method of forming an electronic material layer, according to an embodiment of the present invention.

Referring to FIG. 1, an electronic material layer 2 made of a predetermined material is formed on a template 1.

Figure 2:
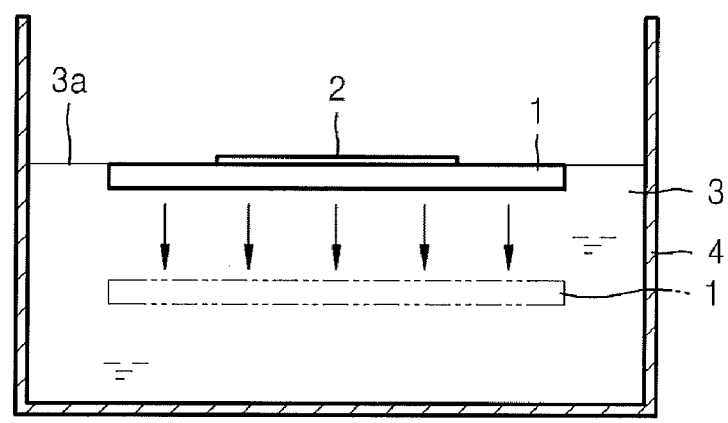

Referring to FIG. 2, the template 1 is dipped into a container 4 in which a liquid medium 3 is stored to separate the electronic material layer 2 from the template 1. The electronic material layer 2 is floated on a surface 3a of the liquid medium 3. To this end, the electronic material layer 2 may have a gravity that is less than that of the liquid medium 3. The liquid medium 3 may be water containing an organic solvent or an acid solution.

Figure 3:
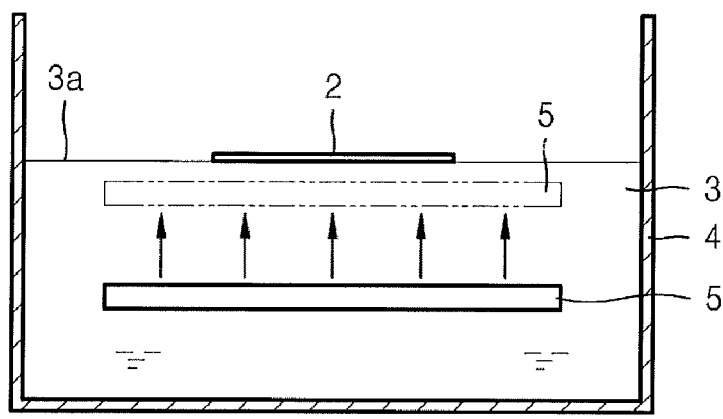

Referring to FIG. 3, a target substrate 5 is moved into a spot under the electronic material layer 2 and the electronic material layer 2 is slowly raised up by using the target substrate 5.

Figure 4:

Referring to FIG. 4, the electronic material layer 2 placed on a surface of the target substrate 5 is dried, and then fixed to the target substrate 5. The electronic material layer 2 may be dried and fixed to the target substrate 5 by heating. The electronic material layer 2 that has been dried is fixed to the target substrate 5 due to a molecular force or a van der Waals force.

The electronic material layer 2 formed on the template 1 should be separated from the template 1 in the liquid medium 3. In this regard, for example, suspension filtering that allows the electronic material layer 2 to be separated from the template 1 with an appropriate force or means may be used. In this case, the template 1 may be formed of a porous material, not a dense material.

As described above, the method of FIGS. 1 through 4 is not a method of directly forming an electron material layer formed of an electronic material on a target substrate, but a method of transferring an electronic material layer to a target substrate by using a liquid medium. The electronic material layer floated on a surface of the liquid medium is patterned into a predetermined shape, and can be attached to the target substrate irrespective of a material of the target material because the electronic material layer floated on the surface of the liquid medium is raised up by the target substrate and thus the electronic material layer can be placed on the target substrate.

The electronic material of the electronic material layer may be a conductive material, a semiconductor material, or a resistive material. The electronic material layer may be used to manufacture a display device, a TFT, a radio frequency identification (RFID) device, an electromagnetic shielding device, an electrostatic dissipation device, an electron emission source, a thermal radiator, a heater, etc.

The electronic material may be divided into an acicular material, a granular material, and a two-dimensional (2D) planar material. Examples of the acicular material may include a tubular, rod-shaped, or ribbon-shaped acicular electron emission material having a constant length, an acicular electron transporting material. Examples of the granular material may include a multi-dimensional granular electron emission material or a granular electron transporting material. Examples of the 2D planar material may include a nano-sized 2D material such as graphene.

A method of forming an electronic material layer made of an acicular material will be explained in detail. In particular, it is assumed that carbon nanotubes (CNTs) are used as the electronic material of the electronic material layer, a liquid medium for separating or floating a CNT layer is an aqueous solution. However, the present invention is not limited to the material of the liquid medium and the electronic material.

First, a template made of Teflon, ceramic, anodic aluminium oxide (AAO), polycarbonate, or the like, and a CNT colloid suspension (referred to as a suspension hereinafter) are prepared. The suspension is a colloidal solution formed by dispersing CNT powder in a solvent or a surfactant. For more uniform dispersion of the CNT powder, ultrasonic treatment may be performed. The template having a filtering function filters the suspension to leave only CNTs on a surface of the template. The suspension is removed, and the CNTs are patterned into a bar-like shape and transferred to a target substrate. Alternatively, the template may not have a filtering function.

The CNTs may be single-walled carbon nanotubes (SWCNTs), double-walled carbon nanotubes (DWCNTs), or multi-walled carbon nanotubes (MWCNTs).

The CNTs are synthesized by arc discharge, catalytic chemical vapor deposition (CVD), plasma enhanced CVD, laser ablation, or the like. The CNTs are primarily composed of carbon. A catalyst which is a transition material, such as iron (Fe), cobalt (Co), nickel (Ni), or gold (Au), may be used The CNTs that have been synthesized are subjected to ultrasonic treatment using at least one of a surfactant, such as sodium dodecyl sulfate (SDS), soduim cholate (SC), sodium dodecylbenzenesulfonate (SDBS), sodium deoxy cholate (DOC), Triton-X, cetyl trimethylammonium bromide (CTAB), cetylpyridinium chloride (CPC), polyethoxylated tallow amine (POEA), benzalkonium chloride (BAC), benzethonium chloride (BZT), or dodecy betaine, and an organic solvent, such as dimethylformamide (DMF), dichlorobenzene (DCB), dichloroethane (DCE), chloroform, n-methylpyrrolidone (NMP), tetrahydrofuran (THF), propanol, ethanol, or methanol to obtain uniform CNTs by using a centrifugal separator.

FIGS. 5 through 10 are a perspective view and cross-sectional views illustrating a method of forming an electronic material layer, according to another embodiment of the present invention.

Figure 5:
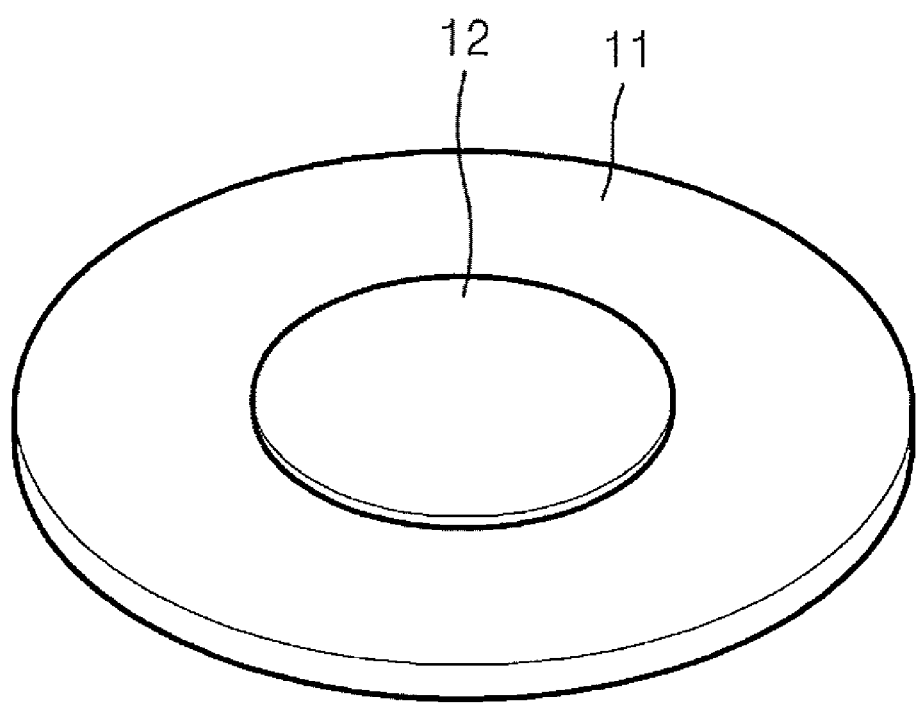
FIGS. 5 through 10 are a perspective view and cross-sectional views illustrating a method of forming an electronic material layer, according to another embodiment of the present invention.

Referring to FIG. 5, a suspension in which CNTs are dispersed is coated in a predetermined pattern on a template 11 that is porous and has a filtering function, and the suspension is dried to form a CNT layer 12. The template 11 may be an AAO membrane.

Once the suspension in which the CNTs are dispersed is coated on the porous template 11, the CNT layer 12 having a uniform thickness can be obtained. The density and the thickness of the CNT layer 12 may be controlled by adjusting the amount of the suspension. If the template 11 is an AAO membrane, the uniformity of the CNT layer 12 made of a material other than AAO may be improved and reliability of separation between the CNT layer 12 and the template 11 may be improved by appropriately selecting a pore size and a material for the template 11.

The predetermined pattern of the suspension coated on the template 11 may be determined according to a field to which the electronic material layer is applied. The density of the CNT layer 12 may be easily controlled by adjusting a concentration ratio of the solvent to the surfactant of the suspension to the CNTs, optimal electron emission and optimal electron transport control may be achieved according to peripheral electrical conditions, and the CNT layer 12 having a uniform density may be formed under optimal conditions. After the suspension is coated in the predetermined pattern on the template 11, only the CNTs are left and a liquid material passes through the template 11. In this state, a drying process is performed to form the CNT layer 12 on a surface of the template 11. The drying process may be air drying or vacuum drying performed at room temperature or at high temperature.

Figure 6:
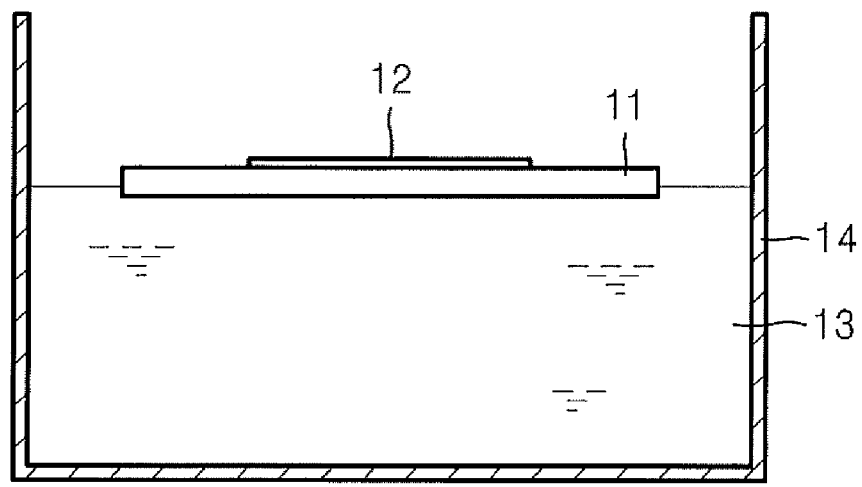

Referring to FIG. 6, the template 11 is dipped into a container 14 that stores an aqueous solution 13 that serves as a liquid medium. The template 11 is floated on a surface of the aqueous solution 13. An additive, such as $HNO_3$, may be put into the aqueous solution 13.

Figure 7:
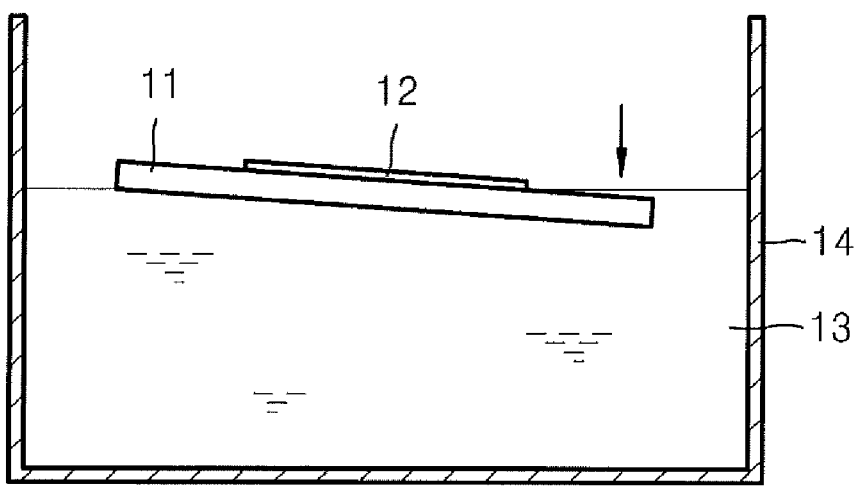

Referring to FIG. 7, the CNT layer 12 is tried to be separated from the surface of the template 11 by pressing down on one side of the template 11. When the template 11 is inclined, the aqueous solution 13 penetrates into an interface between the template 11 and the CNT layer 12, thereby making it possible to separate the CNT layer 12 from the template 11.

Figure 8:
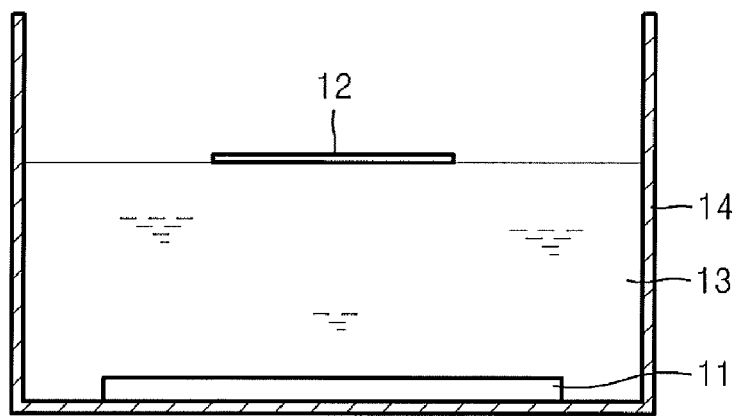

Referring to FIG. 8, when the CNT layer 12 is completely separated from the template 11, the CNT layer 12 is floated on a surface of the aqueous solution 13, and the template 11 is settled at the bottom of the container 14.

Figure 9:
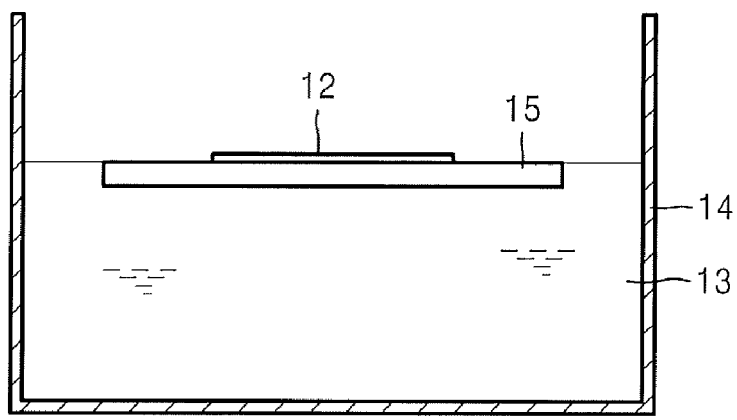

Referring to FIG. 9, after the template 11 is removed from the container 14, a target substrate 15 is dipped into the container 14 to support the CNT layer 12 from below so that the CNT layer 12 is placed on a top surface of the target substrate 15.

Figure 10:

Referring to FIG. 10, after the target substrate 15 is taken out of the container 14, the CNT layer 12 is dried and then fixed to the target substrate 15 by appropriate heating as described above.

FIGS. 11 through 15 are cross-sectional views illustrating a method of forming am electronic material layer, according to another embodiment of the present invention.

Figure 19:
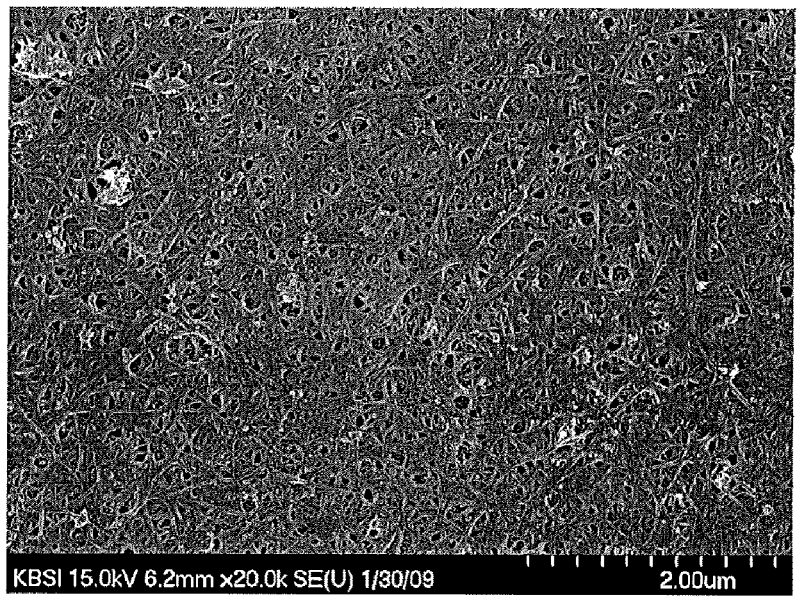
FIG. 19 is a scanning electron microscope (SEM) image illustrating a state where a carbon nanotube (CNT) layer is formed on an anodic aluminum oxide (AAO) membrane that serves as a template.
Figure 20:
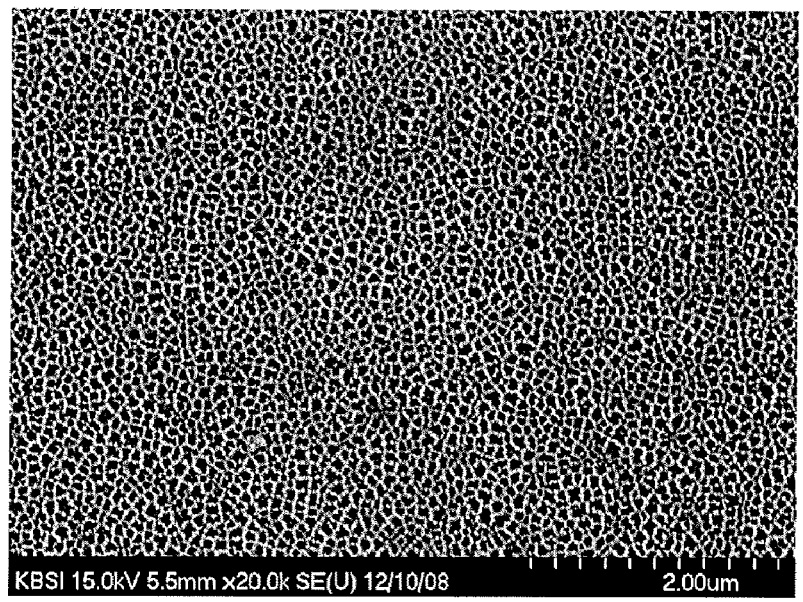
FIG. 20 is an SEM image illustrating a surface of the AAO membrane from which the CNT layer of FIG. 19 is removed.
Figure 21:
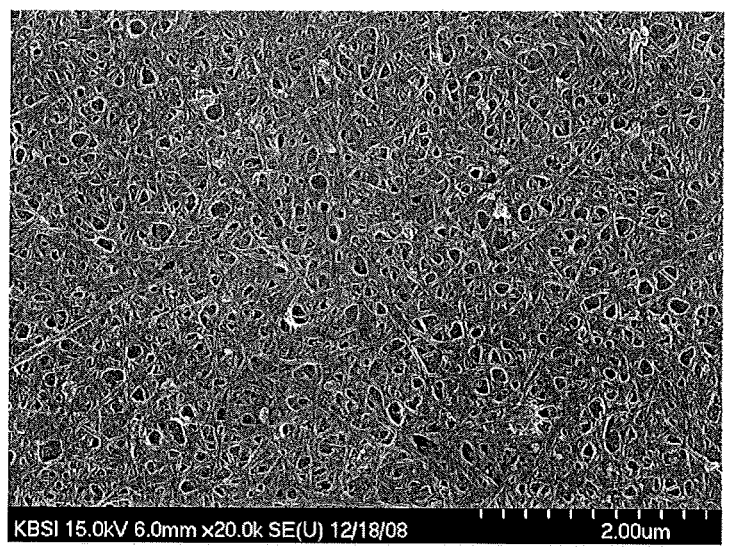
FIG. 21 is an SEM image illustrating a state where the CNT layer of FIG. 19 is transferred to a flexible target substrate formed of polyethylene terepthalate (PET)

18. Referring to FIGS. 19 through 21, after the CNT layer formed on the AAO membrane that is a porous template is completely separated from the AAO membrane in an aqueous solution, the CNT layer is successfully transferred to the flexible target substrate.

Table 1 shows sheet resistances of six CNT layers before and after a transfer process.

TABLE 1

|  |  | #1 | #2 | #3 | #4 | #5 | #6 |
|---|---|---|---|---|---|---|---|
| Transmittance (% T at 550 nm) | | 95.112 | 91.622 | 84.217 | 79.664 | 75.971 | 70.827 |
| Sheet resistance (Ω/sq) | Before transfer | 2493.71 | 1040.71 | 375.939 | 295.065 | 225.688 | 153.048 |
| | After transfer | 1298.46 | 513.181 | 198.393 | 150.109 | 118.988 | 80.4664 |
| Decrement rate (%) | | 52.0695 | 49.3106 | 52.7726 | 50.8732 | 52.72232 | 52.5759 |

Figure 11:
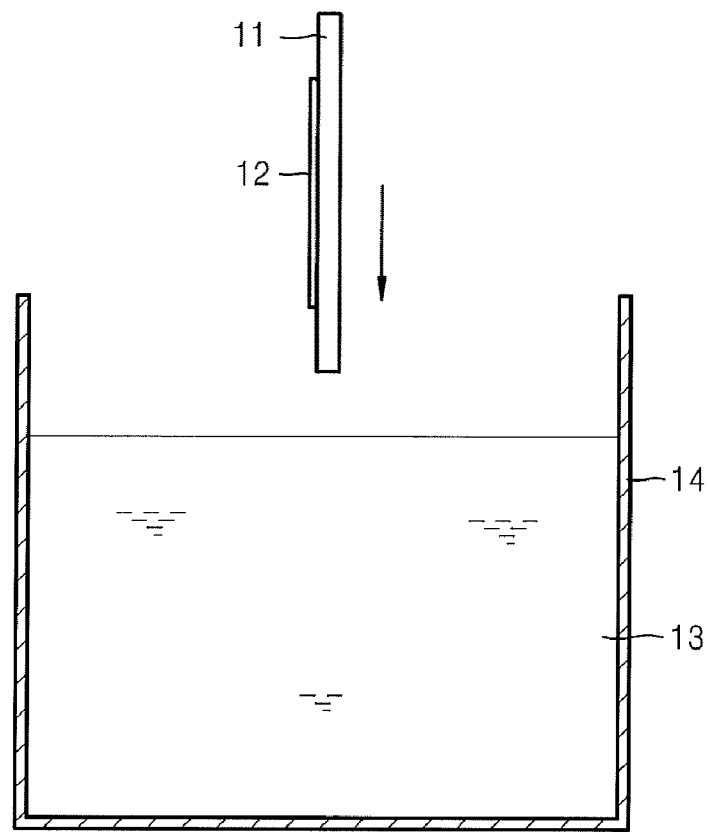
FIGS. 11 through 15 are cross-sectional views illustrating a method of forming an electronic material layer, according to another embodiment of the present invention.

Referring to FIG. 11, in a state where the template 11 on which the CNT layer 12 is formed is maintained erect perpendicular to the surface of the aqueous solution 13 that is stored in the container 14, the template 11 is dipped into the aqueous solution 13.

Figure 12:
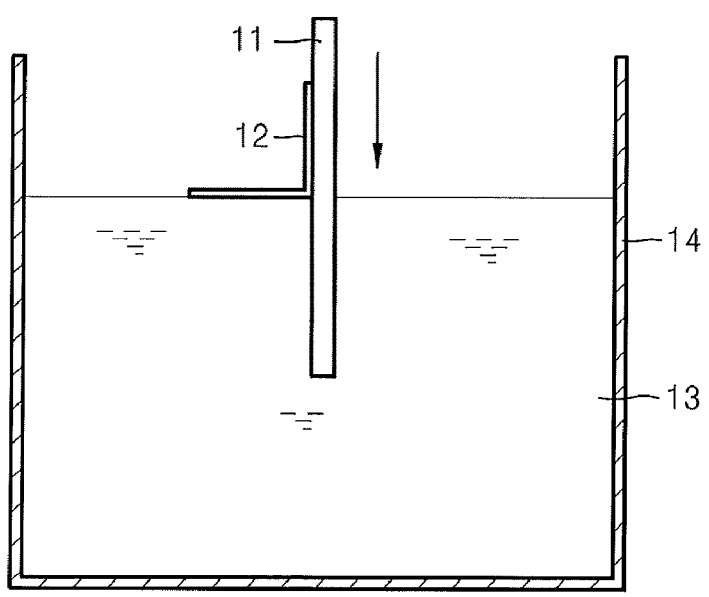

Referring to FIG. 12, when the template 11 is vertically dipped into the aqueous solution 13, the CNT layer 12 starts to be separated from the template 11 due to pressure or capillarity on an interface between the template 11 and the CNT layer 12.

Figure 13:
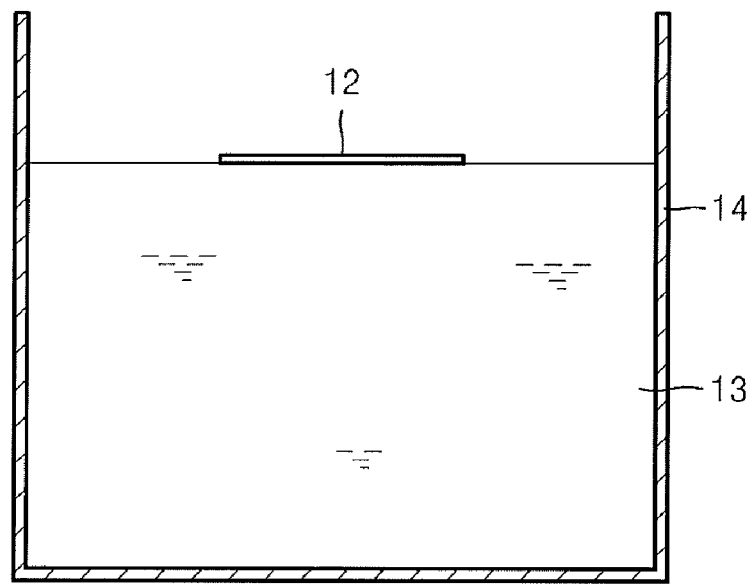

Referring to FIG. 13, when the whole template 11 is dipped in the aqueous solution 13 in such a manner as that described with reference to FIG. 12, the CNT layer 12 is completely separated from the template 11.

Figure 14:
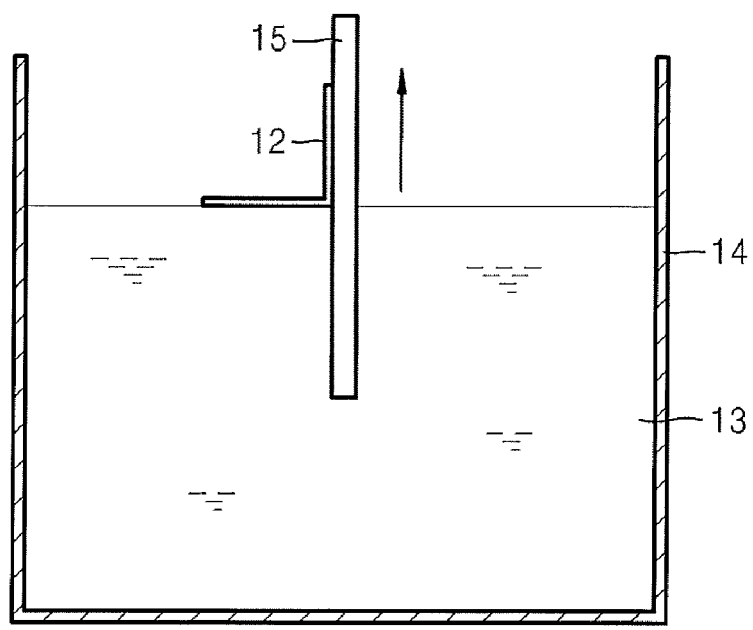
Figure 15:
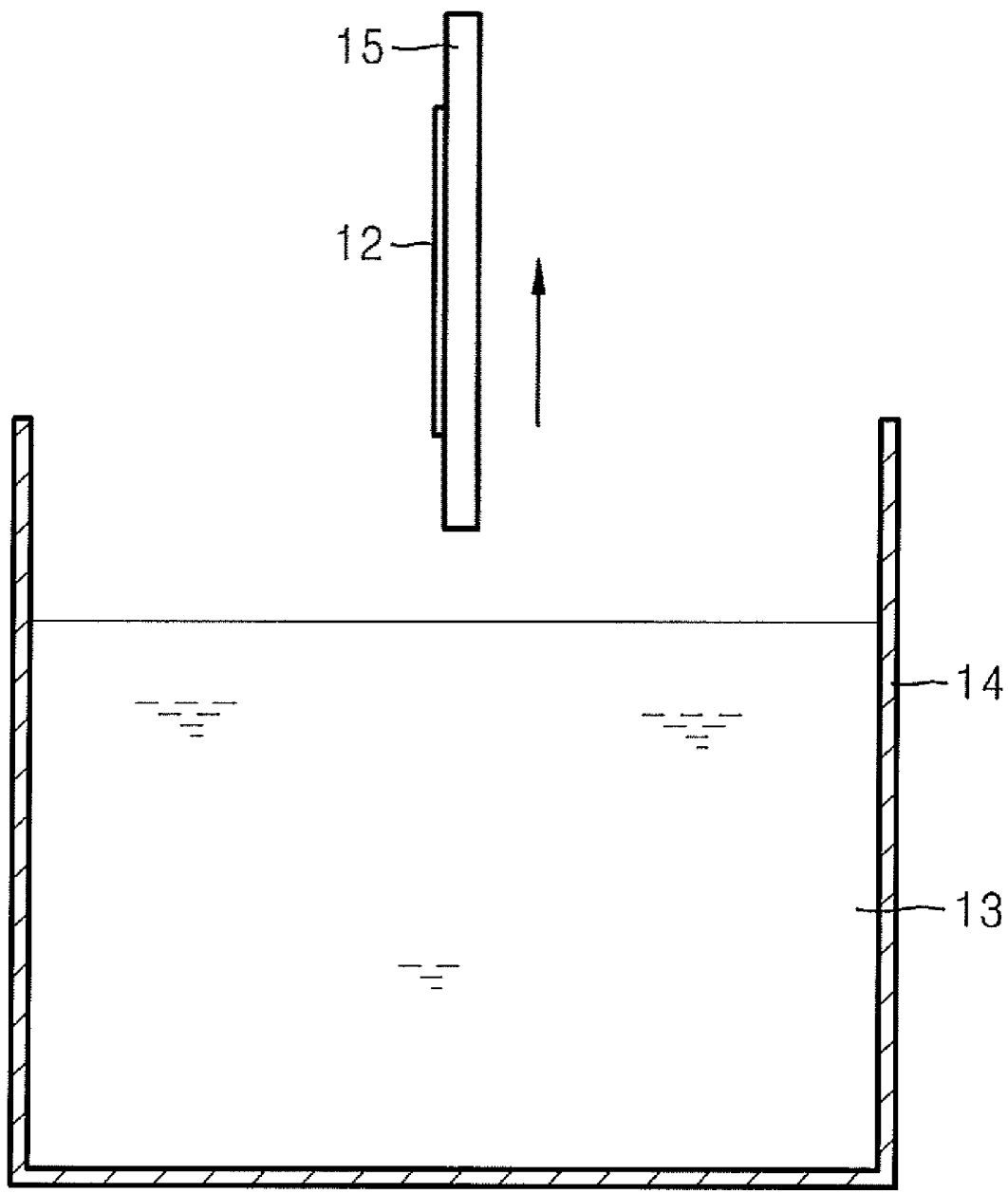

Referring to FIGS. 14 and 15, the target substrate 15 is dipped into a spot under the CNT layer 12 floated on the surface of the aqueous solution 13 and is vertically raised up in a state where one side of the CNT layer 12 is attached to the target substrate 15. The CNT layer 12 attached to the target substrate 15 is dried and fixed to the target substrate 15 as described above.

Figure 16:
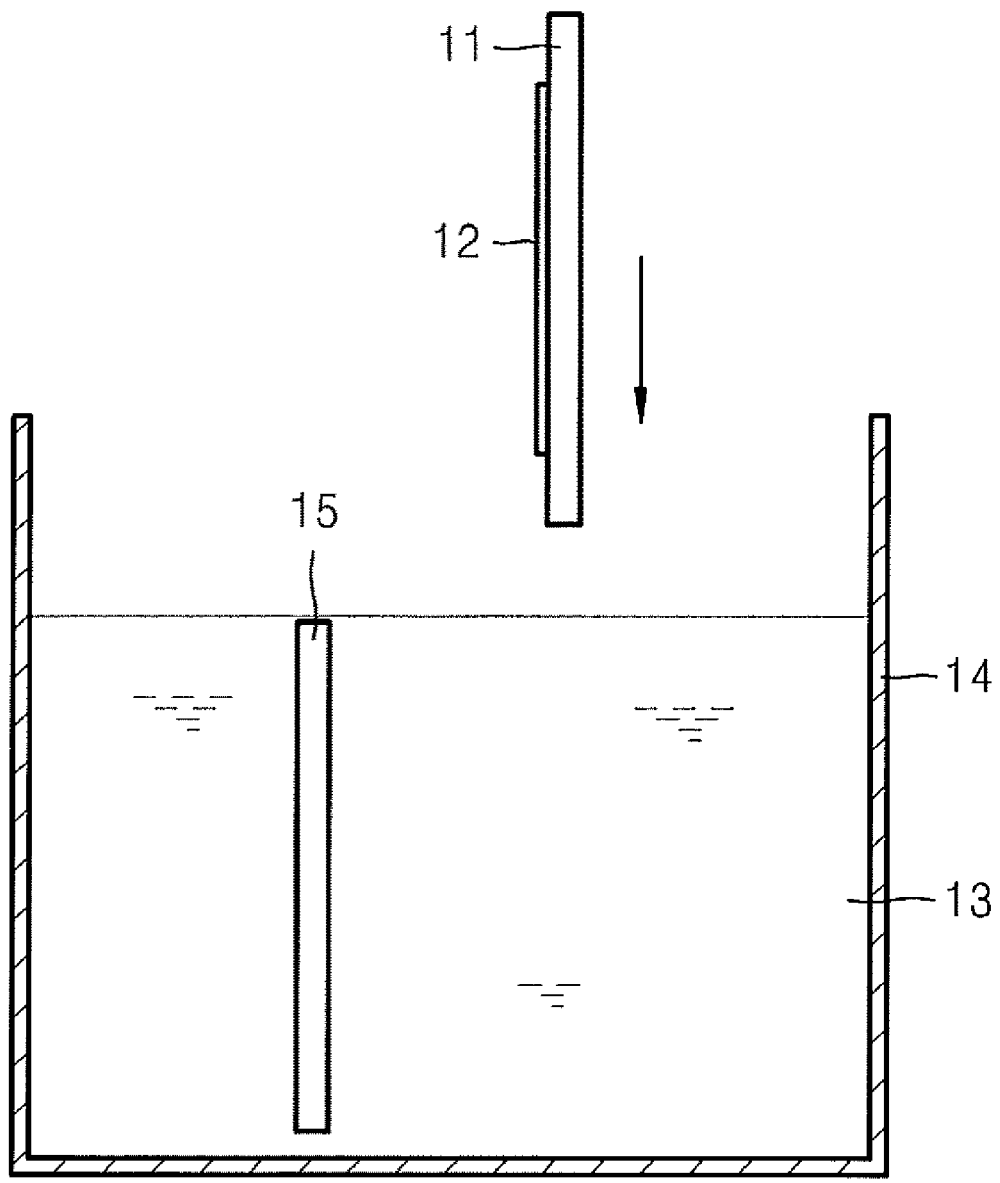
FIGS. 16 through 18 are cross-sectional views illustrating a method of forming an electronic material layer, according to another embodiment of the present invention.

The CNT layer 12 may be separated and transferred at the same time. That is, referring to FIG. 16, in a state where the target substrate 15 is vertically dipped in the aqueous solution 13 in the container 14, the template 11 is also vertically dipped into the aqueous solution 13 in such a manner that the target substrate 15 and the template 11 are spaced apart from each other by a predetermined interval.

Figure 17:
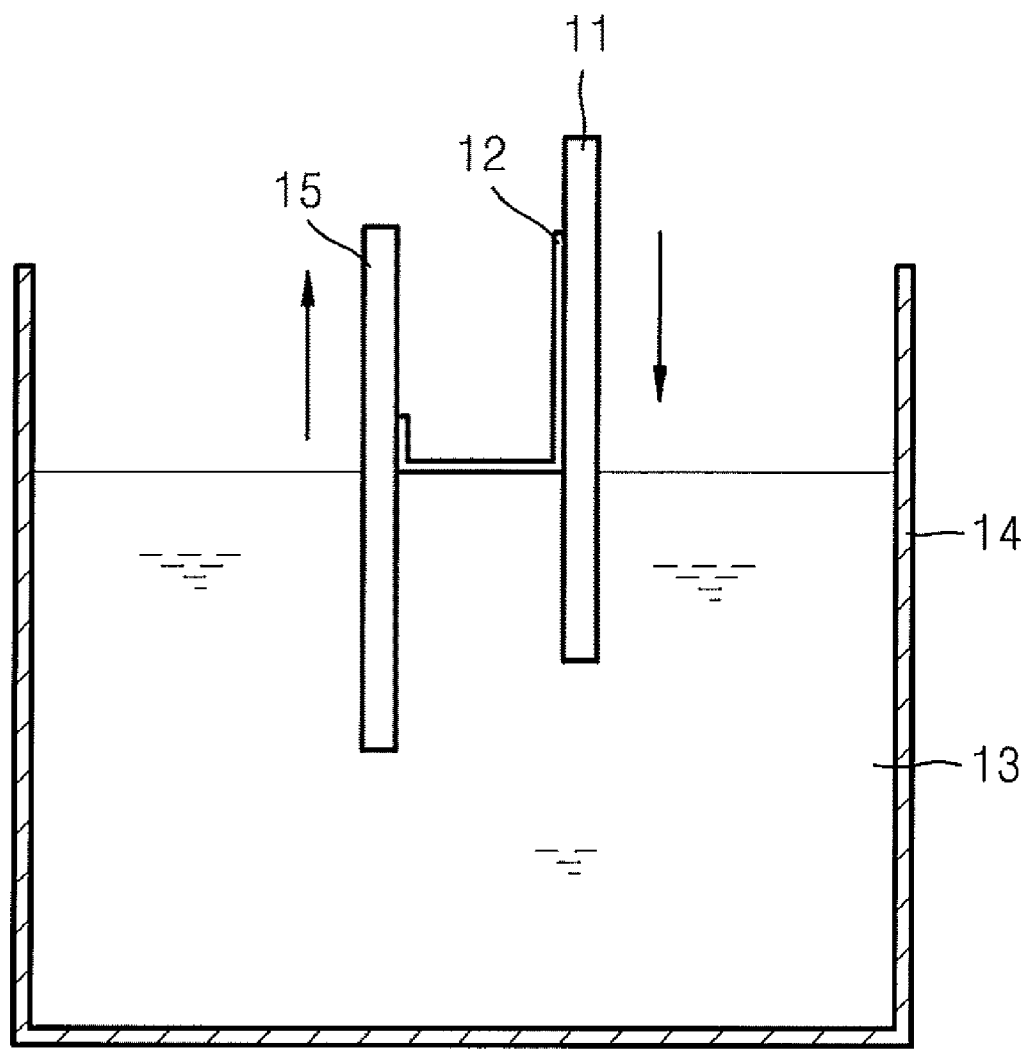

Referring to FIG. 17, the CNT layer 12 starts to be separated from the template 11 as the template 11 contacts the aqueous solution 13. The target substrate 15 is raised up when the target substrate 15 approaches and contacts the CNT layer 12.

Figure 18:
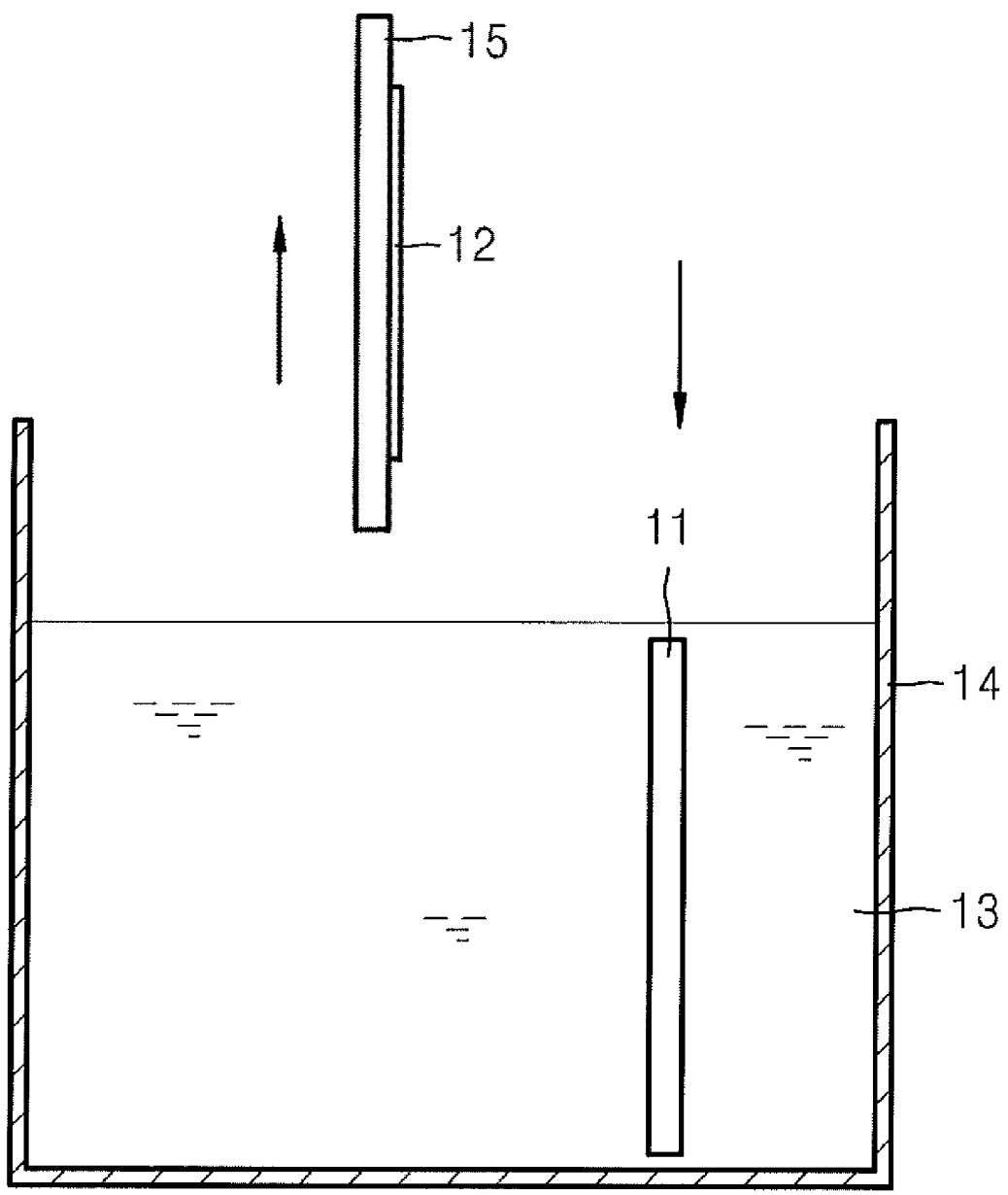

Referring to FIG. 18, the template 11 continues to be lowered to be separated from the CNT layer 12, and the target substrate 15 continues to be raised, thereby completely transferring the CNT layer 12 to the target substrate 15.

FIG. 19 is a scanning electron microscope (SEM) image illustrating a state where a CNT layer is formed on an AAO membrane that serves as a template by any one of the methods of FIGS. 1 through 18. FIG. 20 is an SEM image illustrating a surface of the AAO membrane from which the CNT layer of FIG. 19 is removed by any of the methods of FIGS. 1 through 18. FIG. 21 is an SEM image illustrating a state where the CNT layer of FIG. 19 is transferred to a flexible target substrate formed of polyethylene terepthalate (PET) that serves as a target substrate by any of the methods of FIGS. 1 through Accordingly, the six CNT layers have improved electrical conductivity irrespective of a substrate, and sheet resistances of the six CNT layers to a template after a transfer process are much lower than sheet resistances of the six CNT layers to the template before the transfer process. The reduction in the sheet resistances is resulted from the fact that contact points between CNTs which are physically interconnected in a network are increased due to the transfer process and due to an aqueous solution that is a liquid medium, and thus the number of electrical paths is increased. In Table 1, a transmittance is a ratio of light having a wavelength of 550 nm which passes through each of the six CNT layers.

Figure 22:
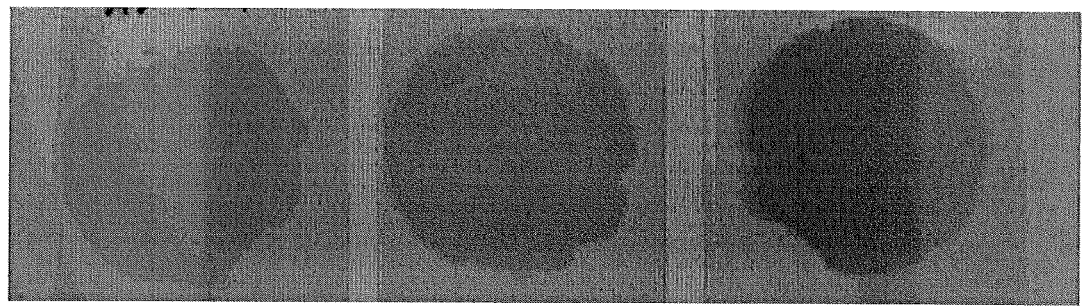
FIG. 22 illustrates three CNT layers, each of which is transferred to a target substrate formed of PET.
Figure 23:
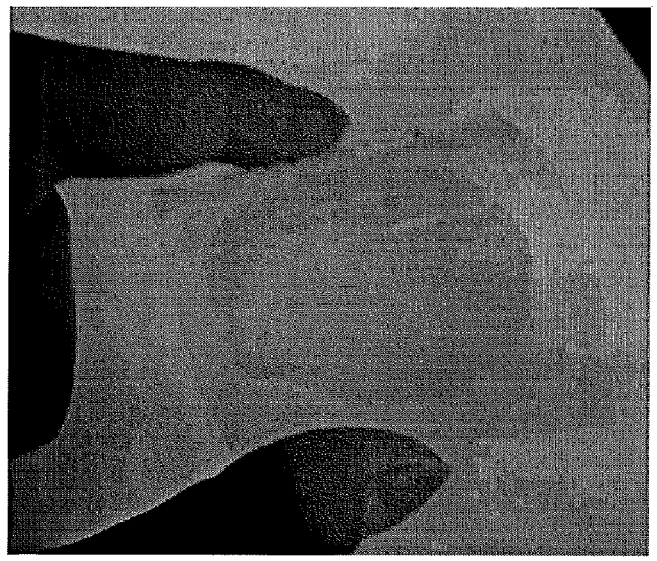
FIG. 23 is an optical image illustrating a state where the target substrate on which one of the three CNT layers of FIG. 22 is formed is arched.
Figure 24:
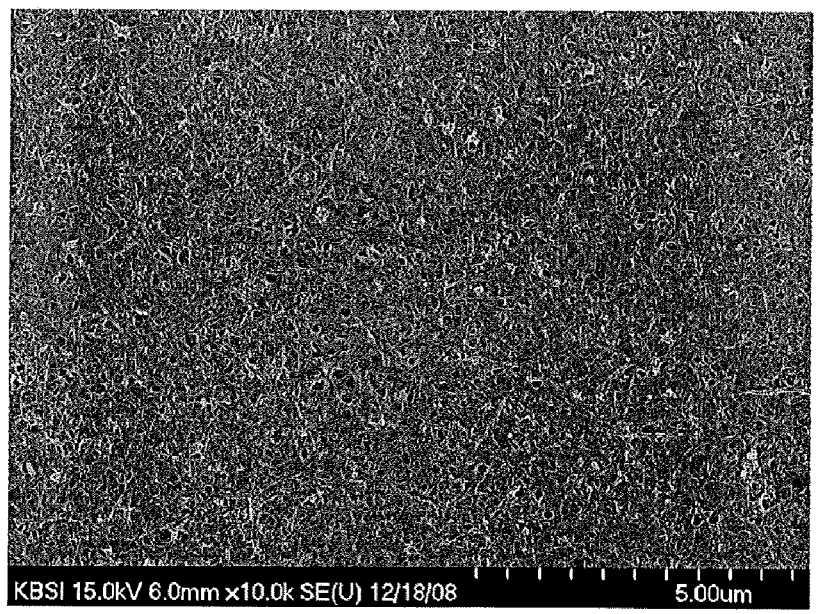
FIG. 24 is an enlarged SEM image illustrating the CNT layer of FIG. 23 transferred to the target substrate.
Figure 25:
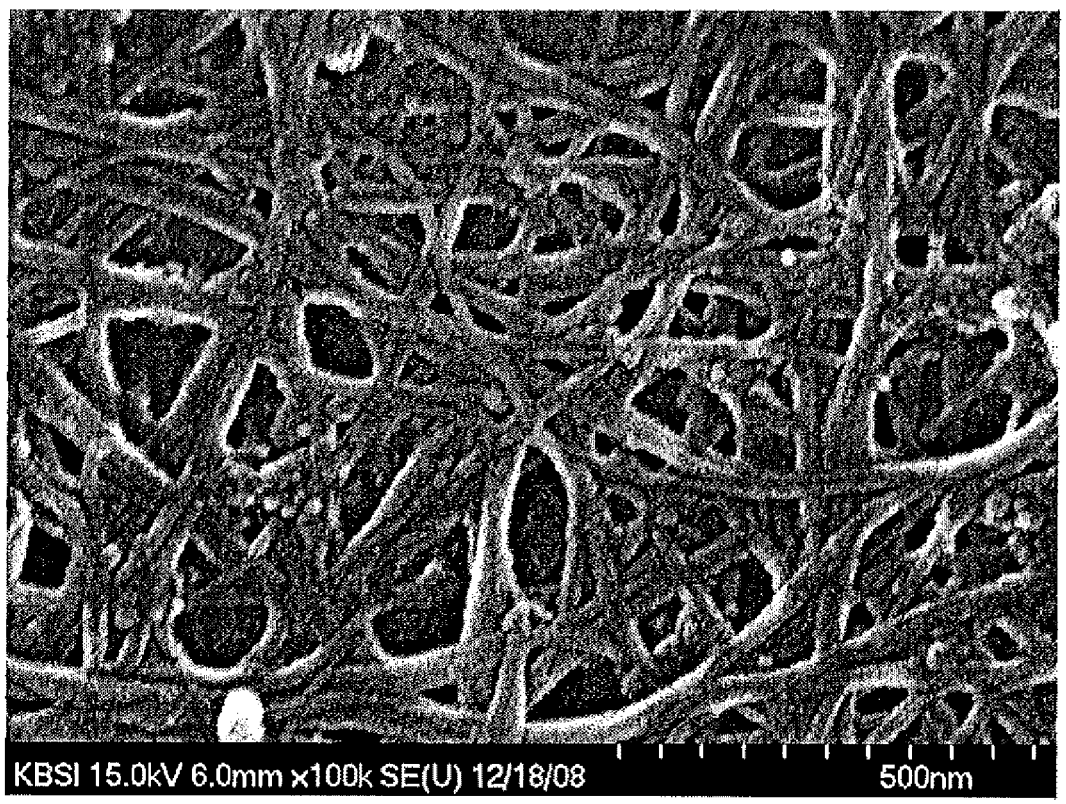
FIG. 25 is a further enlarged SEM image illustrating the CNT layer of FIG. 23.

FIG. 22 illustrates three CNT layers, each of which is transferred to a target substrate formed of PET, by the methods of FIGS. 1 through 18. FIG. 23 is an optical image illustrating a state where the target substrate on which one of the three CNT layers of FIG. 22 is formed is arched. FIG. 24 is an enlarged SEM image of the CNT layer of FIG. 23 transferred to the target substrate. FIG. 25 is a further enlarged SEM image of the CNT layer of FIG. 23.

A process of transferring a CNT layer to a target substrate includes preparing synthesized CNTs, dispersing the CNTs in a solvent, forming a CNT layer on a template through filtering, separating the CNT layer from the template by using a liquid medium, for example, an aqueous solution, and attaching the CNT layer to a target substrate in a state where the CNT layer is floated on a surface of the liquid medium.

In the methods of FIGS. 1 through 18, in order to separate an electronic material layer, that is, a CNT layer, from a template that is porous, an acid solution, such as nitric acid ($HNO_3$), hydrochloric acid (HCl), sulfuric acid ($H_2SO_4$), or fluoric acid (HF), may be added to an aqueous solution that is a liquid medium because the acid solution penetrates into an interface between the CNT layer and the template to uniformly and stably separate the CNT layer from the template. In this case, the template is settled at the bottom of the aqueous solution after the CNT layer is separated therefrom, and the CNT layer is floated on a surface of the aqueous solution. Here, reliable separation between the CNT layer and the template may be achieved by adjusting a speed at which the acid solution penetrates into the interface between the CNT layer and the template through appropriate selection of the acid solution. Also, defects of the CNT layer made when the CNT layer is separated from the template may be reduced by adjusting a speed at which the template is settled down. Reliability of separation between the CNT layer and the template may be further improved by heating the acid solution while the CNT layer is separated from the template and the template is settled down.

A process of attaching the CNT layer to the target substrate includes dipping the target substrate in the aqueous solution that is the liquid medium, and raising up the CNT layer floated on a surface of the aqueous solution. Here, an adhesive force between the CNT layer and the target substrate may be enhanced, defects of the CNT layer may be reduced, and the acid solution remaining on the CNT layer attached to the target substrate may be effectively removed by performing hydrophilic surface treatment or hydrophobic surface treatment on the target substrate.

If the methods of FIGS. 1 through 18 are applied to a method of manufacturing, for example, a TFT, each of the methods of FIGS. 1 through 18 may become a process of forming a film performed during a process of manufacturing a channel layer. After the process of forming the film, a patterning process may be performed to obtain a channel layer. The method of manufacturing the TFT may be easily performed from sufficient understanding of the methods of FIGS. 1 through 18 and a conventional method of manufacturing a TFT.

Figure 26:
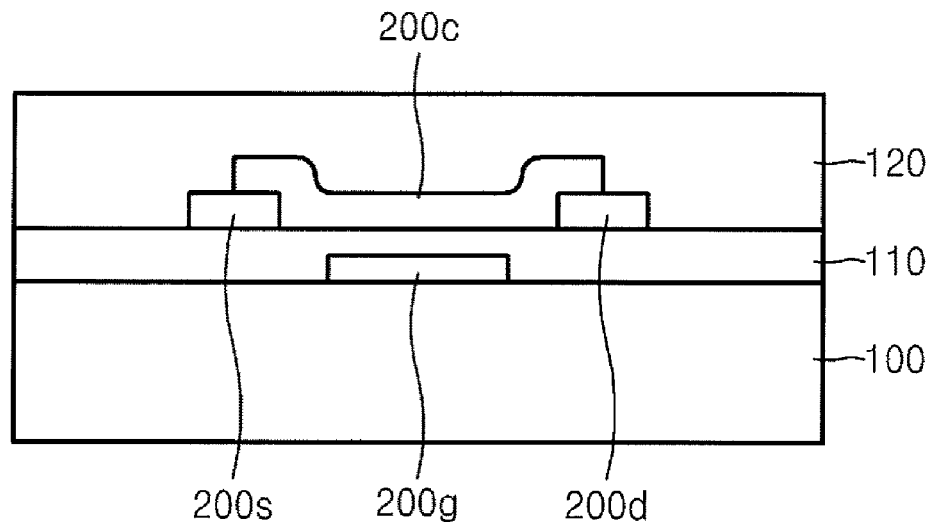
FIG. 26 is a cross-sectional view of a CNT thin film transistor (TFT) according to an embodiment of the present invention.
Figure 27:
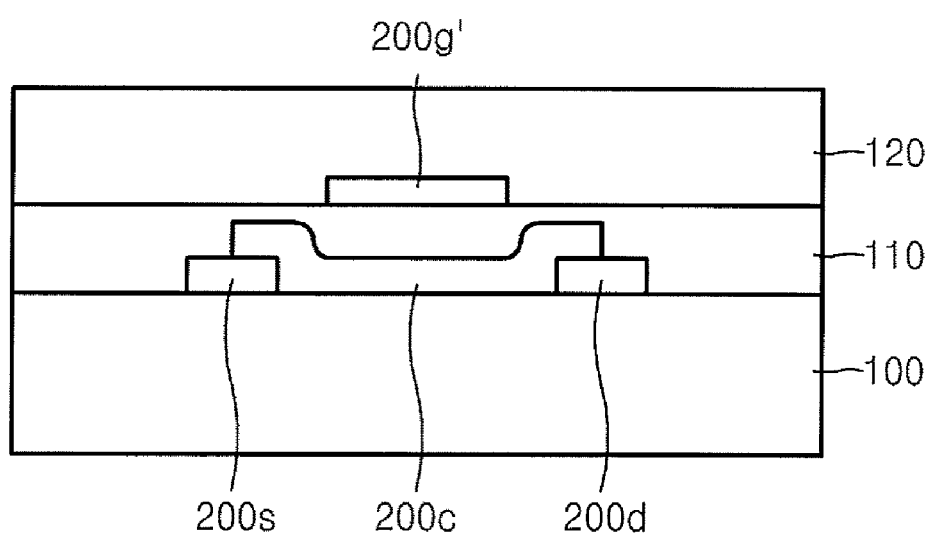
FIG. 27 is a cross-sectional view of a CNT TFT according to another embodiment of the present invention.

FIGS. 26 and 27 are cross-sectional views illustrating CNT TFTs according to embodiments of the present invention. FIG. 26 is a cross-sectional view of a bottom gate TFT and FIG. 26 is a cross-sectional view of a top gate TFT.

Referring to FIG. 26, a gate layer 200g is formed on a substrate 10, and a gate insulating layer 110 is formed on the gate layer 200g. A source 200s and a drain 200d are formed on the gate insulating layer 110 to be located at both sides of the gate layer 200g, and a channel 200c is formed on the source 200s and the drain 200d. Both ends of the channel 200c overlap with the source 200s and the drain 200d. A passivation layer 120 is formed on the channel 200c to protect the channel 200c, the source 200s and the drain 200d, the gate insulating layer 110, the gate layer 200g, and the substrate 100.

Referring to FIG. 27, the source 200s and the drain 200d are disposed on the substrate 100 with a predetermined interval therebetween, and the channel 200c is formed on the source 200s and the drain 200d such that both ends of the channel 200c overlap with the source 200s and the drain 200d. The gate insulating layer 110 is formed on the channel 200c, a gate 200g' is formed on the gate insulating layer 110 to correspond to the channel 200c, and the passivation layer 120 is formed on the gate 200g' to protect the gate 200g', the gate insulating layer 11, the channel 200c, the source 200s and the drain 200d, and the substrate 100.

The channel 200c illustrated in FIGS. 26 and 27 is a final resultant structure obtained from an electronic material layer formed by any of the methods of FIGS. 1 through 18.

As described above, according to the methods of the present invention, an electronic material layer can be successfully formed on a target substrate. That is, an electronic material layer can be formed on a substrate irrespective of a material of the substrate. The methods of the present invention may be applied to various fields requiring electron emission using an electric field and charge (electron) transport control using an electric field, photons, or other factors. For example, the methods of the present invention may be applied to a method of manufacturing a display device, a TFT, an RFID device, an electron shielding device, an electrostatic dissipation device, a thermal radiator, a heater, an electron emission source, and various sensors.

What is claimed is:

1. A method of transferring an electronic material layer from a template, the method comprising:
    forming an electronic material layer on a template by using a suspension containing an electronic material;
    lowering the template with the electronic material layer thereon in a liquid medium from a first end thereof to a second end thereof to controllably separate the electronic material layer from the template upon contact with a surface of the liquid medium and to float the electronic material layer on the surface of the liquid medium;
    lowering a target substrate into the liquid medium;
    transferring the electronic material layer to the target substrate by raising up the target substrate so that the electronic material layer attaches to the target substrate as it separates from a lowered portion of the template; and
    drying the electronic material layer and fixing the electronic material layer to the target substrate.

2. The method of claim 1, wherein the template is a porous substrate.

3. The method of claim 2, wherein the porous substrate is an anodic aluminum oxide (AAO) substrate.

4. The method of claim 1, wherein the liquid medium comprises any one of $HNO_3$, $HCl$, $H_2SO_4$, and $HF$.

5. The method of claim 1, wherein the electronic material layer comprises a conductive material.

6. The method of claim 1, wherein the electronic material layer comprises CNTs.

7. The method of claim 6, wherein the CNTs comprise at least one of SWCNTs, DWCNTs, and MWCNTs.

8. The method of claim 1, wherein the suspension comprises a solvent and a surfactant.

9. The method of claim 1, wherein the drying of the electronic material layer attached to the target substrate comprises vacuum-drying the electronic material layer attached to the target substrate.

10. A method of manufacturing an electronic device using the method of claim 1.

11. The method of claim 1, wherein the template and target substrate are arranged such that a longitudinal axis of the template and a longitudinal axis of the target substrate are vertically oriented.

12. The method of claim 1, wherein the electronic material layer comprises a semiconductor material.

13. The method of claim 1, wherein the electronic material layer comprises a resistive material.

* * * * *